(12) United States Patent
Motoyama

(10) Patent No.: US 6,766,484 B2
(45) Date of Patent: Jul. 20, 2004

(54) METHOD AND APPARATUS FOR FULLY CHARACTERIZING PROPAGATION DELAY THROUGH AN N-INPUT CIRCUIT

(75) Inventor: Ken L. Motoyama, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/272,042

(22) Filed: Oct. 15, 2002

(65) Prior Publication Data
US 2004/0080312 A1 Apr. 29, 2004

(51) Int. Cl.[7] ............................ G11C 29/00; G01R 31/28
(52) U.S. Cl. ................. 714/718; 714/721; 714/724; 714/725; 714/726; 326/16; 326/37; 326/46
(58) Field of Search ........................ 326/16, 37, 46; 714/718, 721, 724–726, 735, 736, 738, 743, 744, 747

(56) References Cited

U.S. PATENT DOCUMENTS 5,905,403 A * 5/1999 Gillette .................... 327/540
6,173,424 B1 * 1/2001 Voshell et al. ............. 714/718
6,479,985 B2 * 11/2002 Lambert .................. 324/158.1

* cited by examiner

*Primary Examiner*—Tibol Tan
(74) *Attorney, Agent, or Firm*—Park, Vaughan & Fleming LLP; Edward J. Grundler (57) ABSTRACT

One embodiment of the present invention provides a system that facilitates fully characterizing propagation delay through an n-input circuit. The system operates by first receiving the n-input circuit. Next, the system establishes programmable voltage sources at each input of the n-input circuit. The system then programs each programmable voltage source to provide a sequence of input patterns to the n-input circuit. This sequence includes the $2^{2n}$ possible transitions between all possible pairs of input patterns. Next, the system measures the propagation delay between the input and the output of the n-input circuit for each transition in the sequence of input patterns and then reports the results.

20 Claims, 6 Drawing Sheets

METHOD AND APPARATUS FOR FULLY CHARACTERIZING PROPAGATION DELAY THROUGH AN N-INPUT CIRCUIT

BACKGROUND

1. Field of the Invention

The present invention relates to techniques for characterizing the performance of electronic circuits. More specifically, the present invention relates to a method and an apparatus for fully characterizing the propagation delay through an n-input circuit.

2. Related Art

As electronic circuits become increasingly faster, timing margins for signals passing through these circuits are becoming progressively tighter. It is consequently becoming more important to be able to fully characterize the propagation delay through elements within these circuits to ensure that the circuits function properly.

Characterizing the propagation delay through an electronic circuit typically involves: (1) establishing a voltage level for each input to the circuit; (2) changing the voltage level for at least one input; and then (3) measuring the delay until related changes appear at the output to the circuit. Note that each input pattern can cause a different propagation delay. Moreover, the propagation delay for a transition from a low voltage to a high voltage can be different from the propagation delay for a corresponding transition from a high voltage to a low voltage. Additionally, simultaneous transitions on two or more inputs can affect the propagation delay. Hence, as the number of inputs to a circuit grows, it becomes increasingly more difficult to ensure that all possible combinations have been tested.

Hence, what is needed is a method and an apparatus that characterizes the propagation delay through an electronic circuit in a manner that ensures that every possible transition is tested.

SUMMARY

One embodiment of the present invention provides a system that facilitates fully characterizing propagation delay through an n-input circuit. The system operates by first receiving the n-input circuit. Next, the system establishes programmable voltage sources at each input of the n-input circuit. The system then programs each programmable voltage source to provide a sequence of input patterns to the n-input circuit. This sequence includes the $2^{2n}$ possible transitions between all possible pairs of input patterns. Next, the system measures the propagation delay between the input and the output of the n-input circuit for each transition in the sequence of input patterns and then reports the results.

In a variation of this embodiment, the n-input circuit can be either a simulated circuit or a physical circuit.

In a further variation, measuring the propagation delay involves recording a minimum delay and a maximum delay between the input and the output of the n-input circuit for each transition in the sequence of input patterns.

In a further variation, each programmable voltage source outputs a first voltage level at a first time and a second voltage level at a second time, with the first voltage level being independent of the second voltage level. Moreover, the first voltage level and the second voltage level can each be set to either a low voltage or a high voltage.

In a further variation, the system provides the sequence of input patterns by first creating separate binary variables representing the first voltage level and the second voltage level for each input of the n-input circuit. The system then changes values of the binary variables in a sequence that ensures that each of the $2^{2n}$ possible transitions is created.

BRIEF DESCRIPTION OF THE FIGURES

Table 1 presents a computer code listing that produces the combinations required for a two input circuit in accordance with an embodiment of the present invention.

Table 2 presents a refined computer code listing that produces the combinations required for a two input circuit in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Circuit Under Test

Figure 1:
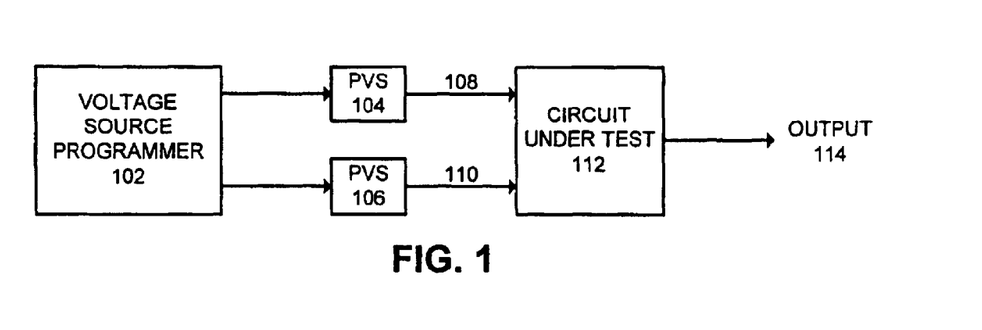
FIG. 1 illustrates a test setup for characterizing a circuit under test in accordance with an embodiment of the present invention.

FIG. 1 illustrates a test setup for characterizing a circuit under test 112 in accordance with an embodiment of the present invention. The test setup includes voltage source programmer 102, programmable voltage sources 104 and 106, and circuit under test 112. Note that the test setup can be applied to simulated components or physical components.

During operation, voltage source programmer 102 provides signals to programmable voltage sources 104 and 106, which cause programmable voltage sources 104 and 106 to output signals 108 and 110, respectively. Signals 108 and 110 are applied to circuit under test 112, which, in turn, provides output 114. The system measures the time between the application of signals 108 and 110 and the signal at output 114. Note that this delay can be different for different combinations of input signals 108 and 110. Also note that while two-input circuit under test 112 is shown, the method can be easily extended to a larger number of inputs.

Programmable voltage sources 104 and 106 receive input signals from voltage source programmer 102. Programmable voltage sources 104 and 106 are substantially identical, therefore only the operation of programmable voltage source 106 will be described herein. Note that additional programmable voltage sources for additional inputs of circuit under test 112 will operate in a substantially identical manner.

Programmable voltage source 106 receives signals from voltage source programmer 102 to provide a first voltage level and a second voltage level as described below in conjunction with FIG. 2. During operation, programmable voltage source 106 switches between the first voltage level and the second voltage level. Note that each programmable voltage source switches between the first voltage level and the second voltage level simultaneously. This simultaneous switching allows characterization of circuit under test 112 for each combination of inputs programmed by voltage source programmer 102.

Voltage source programmer 102 is programmed to provide signals to programmable voltage sources 104 and 106 that cause programmable voltage sources 104 and 106 to supply signals 108 and 110 to circuit under test 112. For each programmable voltage source, voltage source programmer 102 provides two variables, one for the first voltage level and one for the second voltage level. Each of the variables, and hence each voltage level, can be programmed to one of two values. These values correspond to a low voltage level and a high voltage level. In this way, signals 108 and 110 can be independently programmed to transition from a low level to a low level, a low level to a high level, a high level to a low level, or a high level to a high level. Voltage source programmer 102 is programmed to provide each combination of these transitions on signals 108 and 110 so that the propagation delay of circuit under test 112 can be fully characterized.

Assuming that "a_v1" indicates the first voltage level of input a and "a_v2" indicates the second voltage level of input a (and likewise for input b), the C-language code listed in Table 1 produces the combinations required for a two input circuit under test 112. The code extensions for additional inputs will be obvious to a practitioner skilled in the art. The function, run_characterization, causes programmable voltage sources 104 and 106 to apply signals 108 and 110 to circuit under test 112 and to measure the propagation delay between these inputs and output 114.

Note that each variable assumes the values of zero and one for each combination of the other variables. These values provide programming on each input to circuit under test 112 as described below in conjunction with FIGS. 2 and 3.

TABLE 1

Computer Code Listing that Produces the
Combinations Required for a Two Input Circuit

```
for (a_v1=0; a_v1<=1; a_v1++)
  for(a_v2=0; a_v2<=1; a_v2++)
    for (b_v1=0; b_v1<=1; b_v1++)
      for (b_v2=0; b_v2<=1; b_v2++)
        run_characterization (a_v1, a_v2, b_v1, b_v2);
```

An Input Pattern

Figure 2:
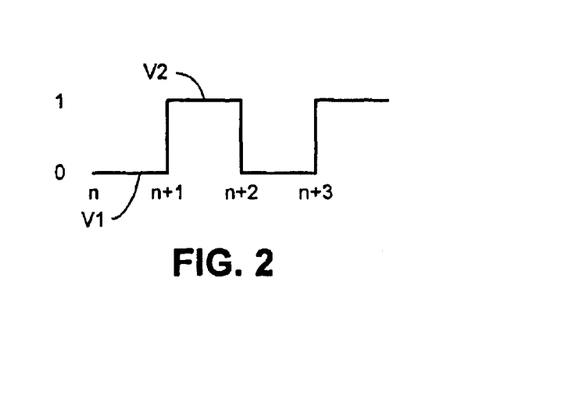
FIG. 2 illustrates an input pattern generated in accordance with an embodiment of the present invention.

FIG. 2 illustrates an input pattern generated in accordance with an embodiment of the present invention. The inputs to a programmable voltage source, say programmable voltage source 106, are set to low for the first voltage level and set to high for the second voltage level. When a clocking signal (not shown) is applied to programmable voltage source 106, signal 110 transitions at each clock signal between the first voltage level and the second voltage level. As illustrated in FIG. 2, between time n and time n+1, V1 is set to low, while between time n+1 and n+2, V2 is set to high. Note that even though a continuous wave is shown, only the transition at n+1 is needed for each combination of inputs to fully characterize the propagation delay of circuit under test 112.

Input Patterns for a Two-input Circuit Under Test

Figure 3A:
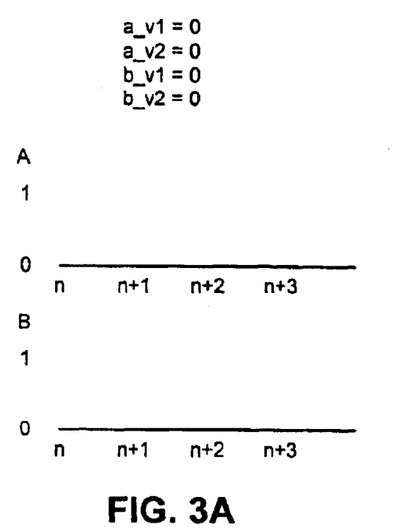
FIG. 3A illustrates an input pattern for a two input circuit in accordance with an embodiment of the present invention.
Figure 3B:
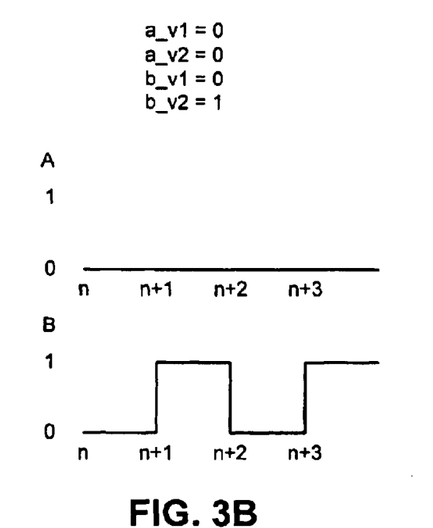
FIG. 3B illustrates an input pattern for a two input circuit in accordance with an embodiment of the present invention.
Figure 3C:
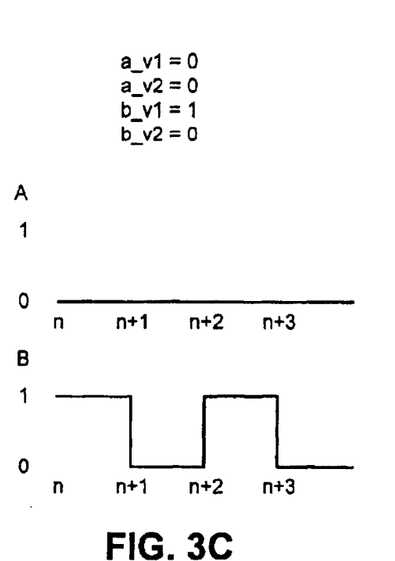
FIG. 3C illustrates an input pattern for a two input circuit in accordance with an embodiment of the present invention.
Figure 3D:
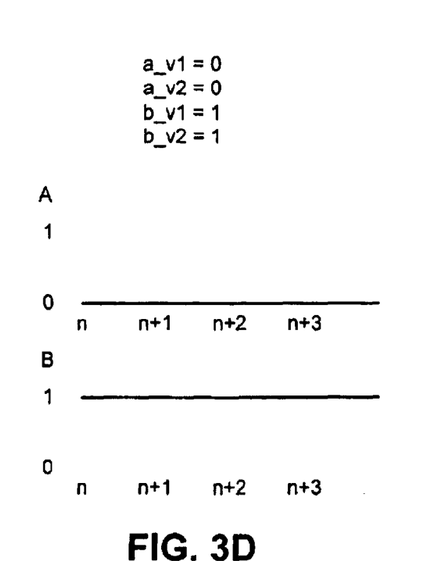
FIG. 3D illustrates an input pattern for a two input circuit in accordance with an embodiment of the present invention.
Figure 3E:
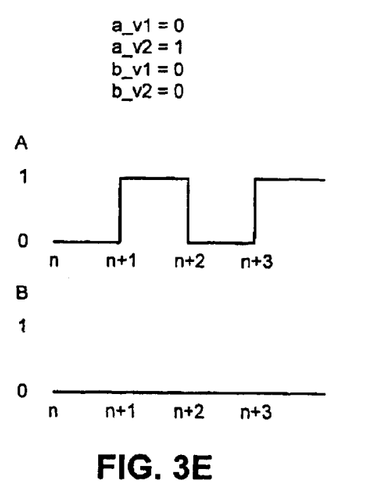
FIG. 3E illustrates an input pattern for a two input circuit in accordance with an embodiment of the present invention.
Figure 3F:
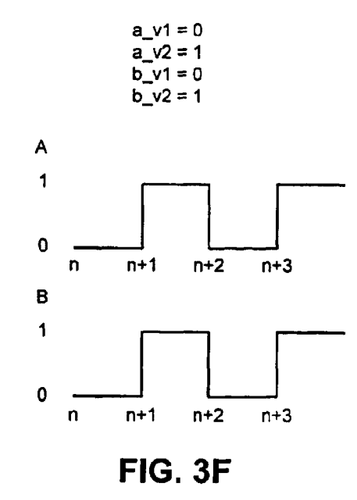
FIG. 3F illustrates an input pattern for a two input circuit in accordance with an embodiment of the present invention.
Figure 3G:
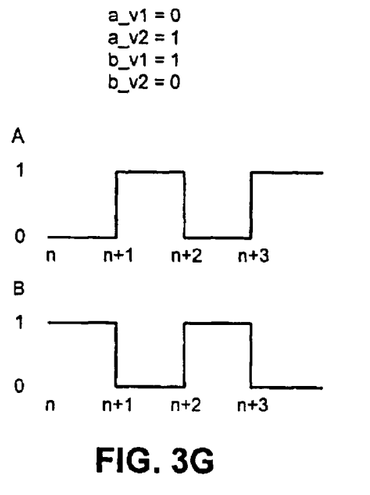
FIG. 3G illustrates an input pattern for a two input circuit in accordance with an embodiment of the present invention.
Figure 3H:
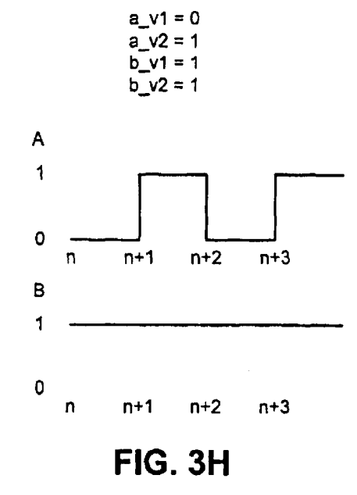
FIG. 3H illustrates an input pattern for a two input circuit in accordance with an embodiment of the present invention.
Figure 3I:
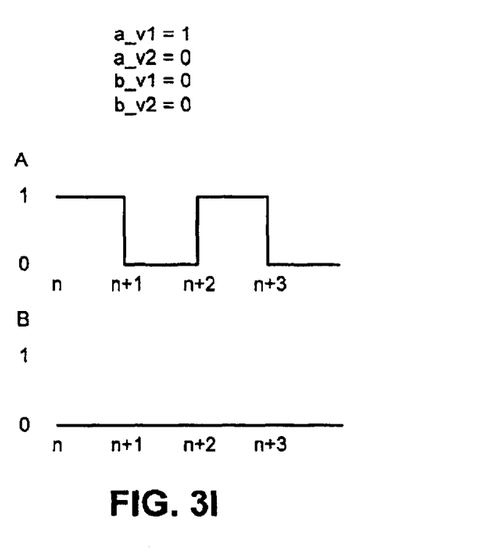
FIG. 3I illustrates an input pattern for a two input circuit in accordance with an embodiment of the present invention.
Figure 3J:
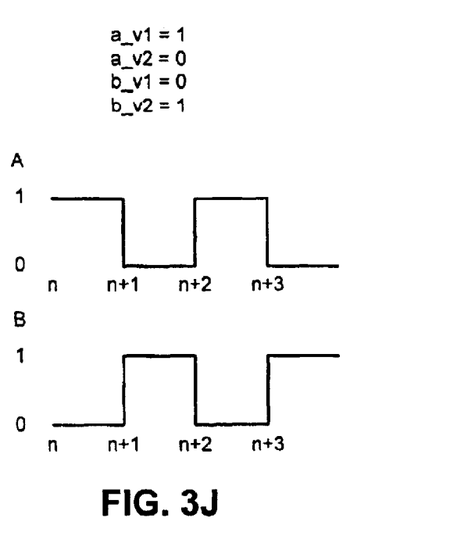
FIG. 3J illustrates an input pattern for a two input circuit in accordance with an embodiment of the present invention.
Figure 3K:
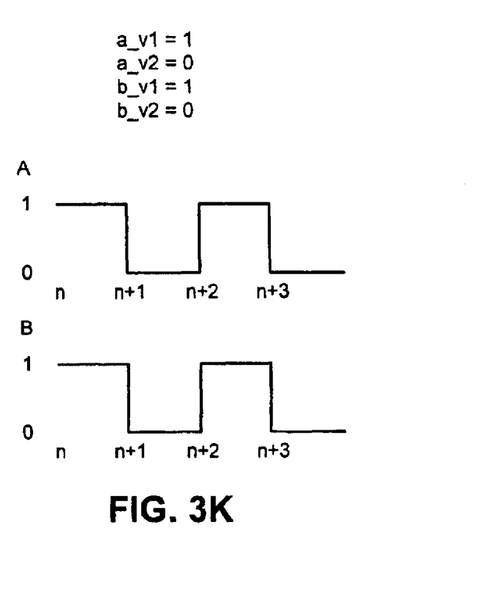
FIG. 3K illustrates an input pattern for a two input circuit in accordance with an embodiment of the present invention.
Figure 3L:
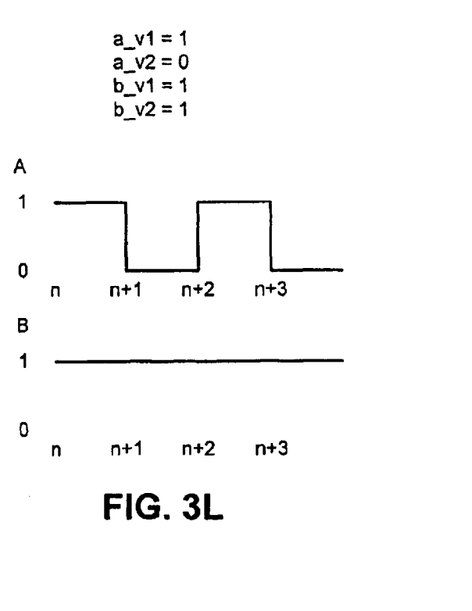
FIG. 3L illustrates an input pattern for a two input circuit in accordance with an embodiment of the present invention.
Figure 3M:
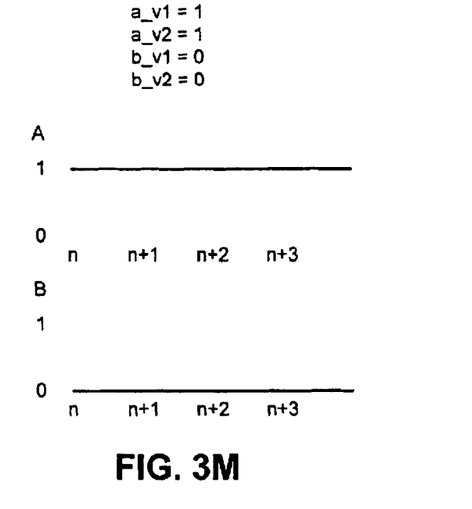
FIG. 3M illustrates an input pattern for a two input circuit in accordance with an embodiment of the present invention.
Figure 3N:
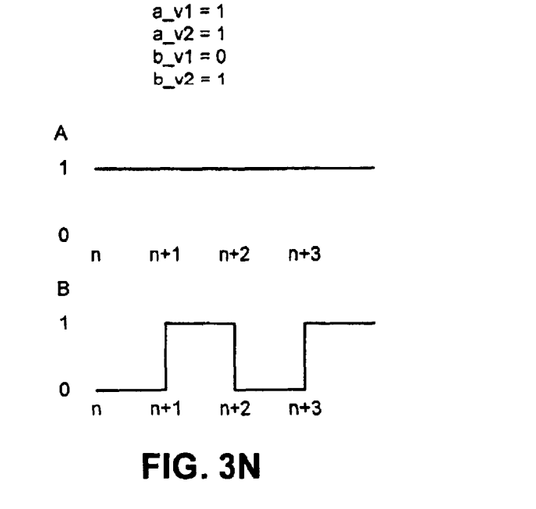
FIG. 3N illustrates an input pattern for a two input circuit in accordance with an embodiment of the present invention.
Figure 3O:
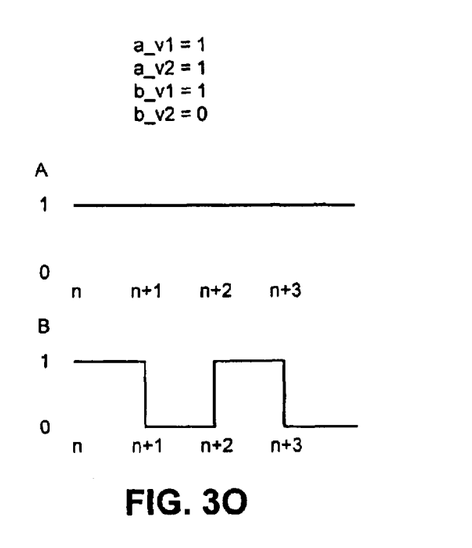
FIG. 3O illustrates an input pattern for a two input circuit in accordance with an embodiment of the present invention.
Figure 3P:
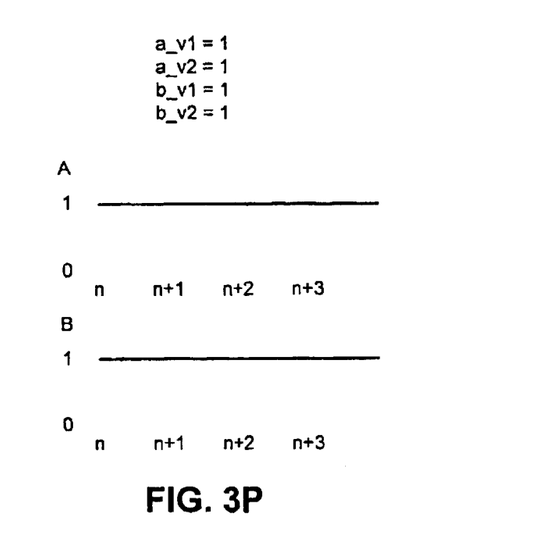
FIG. 3P illustrates an input pattern for a two input circuit in accordance with an embodiment of the present invention.

FIGS. 3A–P illustrate a series of input patterns for a two input circuit in accordance with an embodiment of the present invention. Each of FIGS. 3A–P illustrates a particular combination of voltage levels for inputs a and b of a two input circuit under test 112. For example, in FIG. 3A, both v1 and v2 for inputs a and b are zero. Since both voltages are low for both time slots, there are no transitions on either signal 108 or 110 from programmable voltage sources 104 and 106. Signals 108 and 110 are identified as A and B in FIGS. 3A–P.

In FIG. 3G, however, a_v1 is zero, a_v2 is one, b_v1 is zero, and b_v2 is one. As a result, signal 108, A transitions from low to high at n+1, while signal 110, B transitions from high to low at n+1. Each of FIGS. 3A–3P illustrate a different combination for inputs a and b. The combinations illustrated in FIGS. 3A, 3D, 3M, and 3P have no transitions at time n+1, and therefore, have no influence on the characterization of circuit under test 112. Table 2 includes a modification of the C-language code, which eliminates these combinations from consideration.

TABLE 2

Refined Computer Code Listing that Produces the Combination Required for a Two Input Circuit

```
for (a_v1=0; a_v1<=1; a_v1++)
  for (a_v2=0; a_v2<=1; a_v2++)
    for (b_v1=0; b_v1<=1; b_v1++)
      for(b_v2=0; b_v2<=1; b_v2++)
        if {(a_v1 != a_v2) || (b_v1 != b_v2)}
          run_characterization(a_v1, a_v2, b_v1, b_v2);
```

Generating Test Patterns

Figure 4:
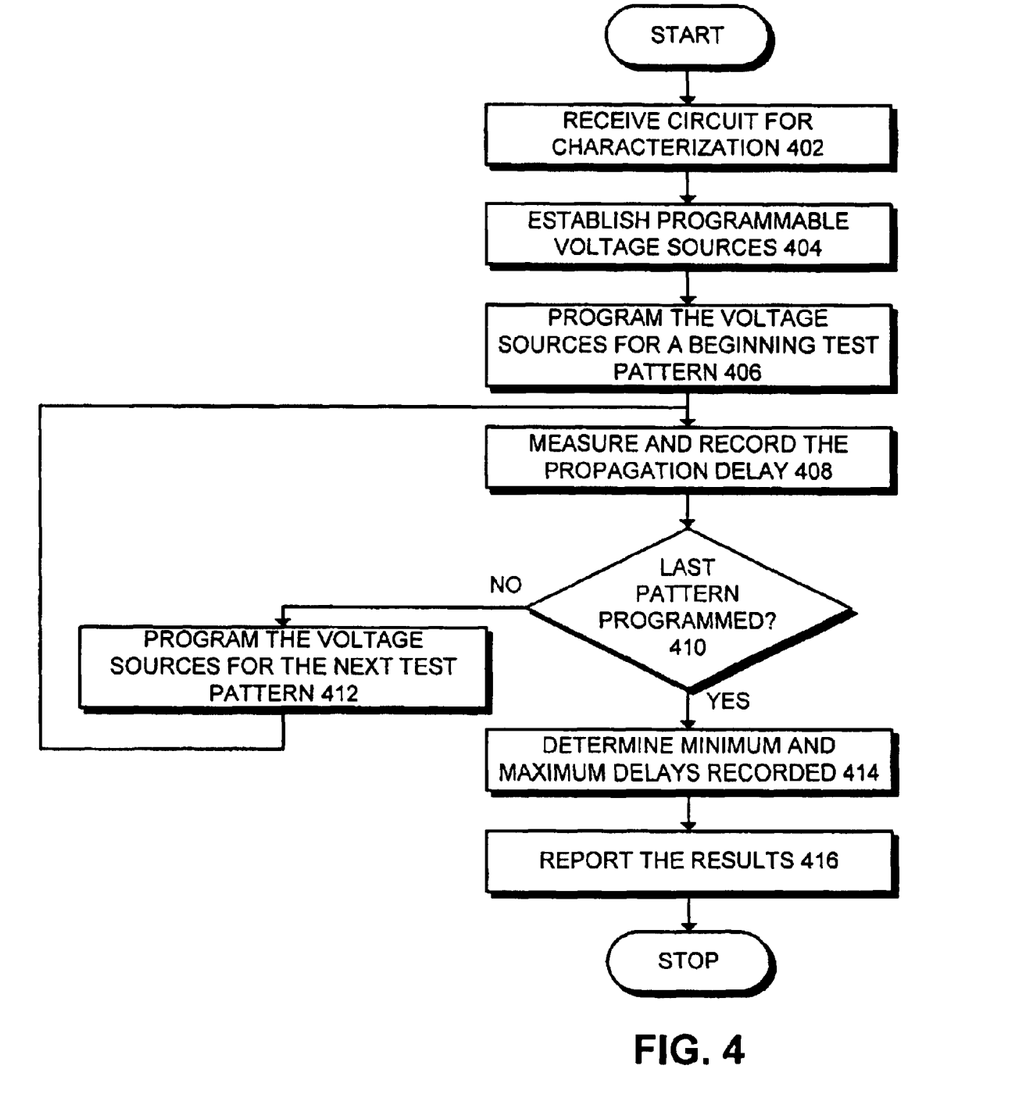
FIG. 4 is a flowchart illustrating the process of generating a series of test patterns in accordance with an embodiment of the present invention.

FIG. 4 is a flowchart illustrating the process of generating a series of test patterns in accordance with an embodiment of the present invention. The system starts by receiving a circuit, circuit under test 112, for characterization (step 402). Next, the system establishes programmable voltage sources for each input of circuit under test 112 (step 404). Next, voltage source programmer 102 programs the programmable voltage sources for a given test pattern (step 406). The system then measures and records the propagation delay for the given test pattern (step 408).

After measuring and recording the propagation delay, voltage source programmer 102 determines if the given test pattern is the last test pattern (step 410). If not, voltage source programmer 102 programs the programmable voltage sources for the next test pattern (step 412). The process then returns to step 408 to measure and record the propagation delay for the next pattern.

If the given test pattern was the last test pattern at step 410, the system determines the minimum and maximum delays that were recorded for the set of input patterns (step 414). Finally, the system reports the results obtained from characterizing the propagation delay times for circuit under test 112 (step 416).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fully characterizing propagation delay through an n-input circuit, comprising:
   receiving the n-input circuit;
   establishing programmable voltage sources at each input of the n-input circuit;
   programming each programmable voltage source to provide a sequence of input patterns to the n-input circuit, wherein the sequence includes the $2^{2n}$ possible transitions between all possible pairs of input patterns;
   measuring a propagation delay between the input and the output of the n-input circuit for each transition in the sequence of input patterns; and
   reporting a result of measuring the propagation delay.

2. The method of claim 1, wherein the n-input circuit is either a simulated circuit or a physical circuit.

3. The method of claim 1, wherein measuring the propagation delay involves recording a minimum delay and a maximum delay between the input and the output of the n-input circuit for transitions in the sequence of input patterns.

4. The method of claim 1,
   wherein a programmable voltage source outputs a first voltage level at a first time and a second voltage level at a second time,
   wherein the first voltage level is independent of the second voltage level, and
   wherein the first voltage level and the second voltage level can be set to either a low voltage or a high voltage.

5. The method of claim 1, wherein providing the sequence of input patterns involves:
   creating separate binary variables representing a first voltage level and a second voltage level for each input of the n-input circuit; and
   changing values of the binary variables in a sequence to ensure that each of the $2^{2n}$ possible transitions is created.

6. A computer-readable storage medium storing instructions that when executed by a computer cause the computer to perform a method for fully characterizing propagation delay through an n-input circuit, the method comprising:
   receiving the n-input circuit;
   establishing programmable voltage sources at each input of the n-input circuit;
   programming each programmable voltage source to provide a sequence of input patterns to the n-input circuit, wherein the sequence includes the $2^{2n}$ possible transitions between all possible pairs of input patterns;
   measuring a propagation delay between the input and the output of the n-input circuit for each transition in the sequence of input patterns; and
   reporting a result of measuring the propagation delay.

7. The computer-readable storage medium of claim 6, wherein the n-input circuit is either a: simulated circuit or a physical circuit.

8. The computer-readable storage medium of claim 6, wherein measuring the propagation delay involves recording a minimum delay and a maximum delay between the input and the output of the n-input circuit for transitions in the sequence of input patterns.

9. The computer-readable storage medium of claim 6,
   wherein a programmable voltage source outputs a first voltage level at a first time and a second voltage level at a second time,
   wherein the first voltage level is independent of the second voltage level, and
   wherein the first voltage level and the second voltage level can be set to either a low voltage or a high voltage.

10. The computer-readable storage medium of claim 6, wherein providing the sequence of input patterns involves:
    creating separate binary variables representing a first voltage level and a second voltage level for each input of the n-input circuit; and
    changing values of the binary variables in a sequence to ensure that each of the $2^{2n}$ possible transitions is created.

11. An apparatus for fully characterizing propagation delay through an n-input circuit, comprising:
    a receiving mechanism configured to receive the n-input circuit;
    an establishing mechanism configured to establish programmable voltage sources at each input of the n-input circuit;

a programming mechanism configured to program each programmable voltage source to provide a sequence of input patterns to the n-input circuit, wherein the sequence includes the $2^{2n}$ possible transitions between all possible pairs of input patterns;

a measuring mechanism configured to measure a propagation delay between the input and the output of the n-input circuit for each transition in the sequence of input patterns; and a reporting mechanism configured to report a result of measuring the propagation delay.

12. The apparatus of claim 11, wherein the n-input circuit is either a simulated circuit or a physical circuit.

13. The apparatus of claim 11, further comprising a recording mechanism configured to record a minimum delay and a maximum delay between the input and the output of the n-input circuit for transitions in the sequence of input patterns.

14. The apparatus of claim 11, wherein a programmable voltage source outputs a first voltage level at a first time and a second voltage level at a second time, wherein the first voltage level is independent of the second voltage level, and wherein the first voltage level and the second voltage level can be set to either a low voltage or a high voltage.

15. The apparatus of claim 11, further comprising:

a creating mechanism configured to create separate binary variables representing a first voltage level and a second voltage level for each input of the n-input circuit; and a value changing mechanism configured to change values of the binary variables in a sequence to ensure that each of the $2^{2n}$ possible transitions is created.

16. A test system for fully characterizing propagation delay through an n-input circuit, comprising:

a receiving mechanism configured to receive the n-input circuit;

an establishing mechanism configured to establish programmable voltage sources at each input of the n-input circuit;

a programming mechanism configured to program each programmable voltage source to provide a sequence of input patterns to the n-input circuit, wherein the sequence includes the $2^{2n}$ possible transitions between all possible pairs of input patterns;

a measuring mechanism configured to measure a propagation delay between the input and the output of the n-input circuit for each transition in the sequence of input patterns; and a reporting mechanism configured to report a result of measuring the propagation delay.

17. The test system of claim 16, wherein the n-input circuit is either a simulated circuit or a physical circuit.

18. The test system of claim 16, farther comprising a recording mechanism configured to record a minimum delay and a maximum delay between the input and the output of the n-input circuit for transitions in the sequence of input patterns.

19. The test system of claim 16, wherein a programmable voltage source outputs a first voltage level at a first time and a second voltage level at a second time, wherein the first voltage level is independent of the second voltage level, and wherein the first voltage level and the second voltage level can be set to either a low voltage or a high voltage.

20. The test system of claim 16, further comprising:

a creating mechanism configured to create separate binary variables representing a first voltage level and a second voltage level for each input of the n-input circuit; and a value changing mechanism configured to change values of the binary variables in a sequence to ensure that each of the $2^{2n}$ possible transitions is created.

* * * * *

UNITED STATES PATENT AND TRADEMARK OFFICE
CERTIFICATE OF CORRECTION

PATENT NO. : 6,766,484 B2  Page 1 of 1
DATED : July 20, 2004
INVENTOR(S) : Ken L. Motoyama It is certified that error appears in the above-identified patent and that said Letters Patent is hereby corrected as shown below:

Column 8,
Line 17, please delete the word, "farther" and replace with the word -- further --.

Signed and Sealed this

Sixteenth Day of November, 2004

JON W. DUDAS
*Director of the United States Patent and Trademark Office*